United States Patent
Henley

(10) Patent No.: US 10,087,551 B2
(45) Date of Patent: Oct. 2, 2018

(54) METHOD AND DEVICE FOR SLICING A SHAPED SILICON INGOT USING LAYER TRANSFER

(71) Applicant: Silicon Genesis Corporation, San Jose, CA (US)

(72) Inventor: Francois J. Henley, Santa Clara, CA (US)

(73) Assignee: SILICON GENESIS CORPORATION, Santa Clara, CA (US)

(*) Notice: Subject to any disclaimer, the term of this patent is extended or adjusted under 35 U.S.C. 154(b) by 7 days.

(21) Appl. No.: 15/264,525

(22) Filed: Sep. 13, 2016

(65) Prior Publication Data

US 2017/0002479 A1 Jan. 5, 2017

Related U.S. Application Data

(63) Continuation of application No. 14/106,002, filed on Dec. 13, 2013, now Pat. No. 9,460,908, which is a
(Continued)

(51) Int. Cl.
*C30B 15/36* (2006.01)
*C30B 29/06* (2006.01)
(Continued)

(52) U.S. Cl.
CPC .............. *C30B 29/06* (2013.01); *B28D 5/045* (2013.01); *C01B 33/02* (2013.01); *C30B 33/00* (2013.01); *C30B 33/06* (2013.01); *H01L 21/0201* (2013.01); *H01L 21/02027* (2013.01); *H01L 31/1804* (2013.01)

(58) Field of Classification Search
CPC .......... C30B 29/06; C30B 15/36; C30B 15/00
See application file for complete search history.

(56) References Cited

U.S. PATENT DOCUMENTS

| 3,325,314 A | 6/1967 | Alleqretti | |
| 5,878,737 A * | 3/1999 | Hodsden | B28D 5/0082 125/16.02 |

(Continued)

FOREIGN PATENT DOCUMENTS

WO WO 99/02295 * 1/1999

*Primary Examiner* — Robert M Kunemund

(57) ABSTRACT

A method for slicing a crystalline material ingot includes providing a crystalline material boule characterized by a cropped structure including a first end-face, a second end-face, and a length along an axis in a first crystallographic direction extending from the first end-face to the second end-face. The method also includes cutting the crystalline material boule substantially through a first crystallographic plane in parallel to the axis to separate the crystalline material boule into a first portion with a first surface and a second portion with a second surface. The first surface and the second surface are planar surfaces substantially along the first crystallographic plane. The method further includes exposing either the first surface of the first portion or the second surface of the second portion, and performing a layer transfer process to form a crystalline material sheet from either the first surface of the first portion or from the second surface of the second portion.

20 Claims, 13 Drawing Sheets

Related U.S. Application Data continuation of application No. 12/384,926, filed on Apr. 10, 2009, now Pat. No. 8,623,137.

(60) Provisional application No. 61/051,344, filed on May 7, 2008.

(51) Int. Cl.
*C30B 33/00* (2006.01)
*H01L 21/02* (2006.01)
*C30B 33/06* (2006.01)
*B28D 5/04* (2006.01)
*C01B 33/02* (2006.01)
*H01L 31/18* (2006.01)

(56) References Cited

U.S. PATENT DOCUMENTS

| | | | |
|---|---|---|---|
| 6,004,393 A * | 12/1999 | Maeda | C30B 15/20 117/200 |
| 6,010,579 A | 1/2000 | Henley et al. | |
| 6,086,670 A | 7/2000 | Ito | |
| 6,159,825 A | 12/2000 | Henley et al. | |
| 6,225,668 B1 | 5/2001 | Shindo et al. | |
| 6,335,264 B1 | 1/2002 | Henley et al. | |
| 6,391,740 B1 | 5/2002 | Cheunq et al. | |
| 6,511,899 B1 | 1/2003 | Henley et al. | |
| 6,677,214 B1 | 1/2004 | Shindo et al. | |
| 7,075,104 B2 | 7/2006 | Faris | |
| 7,160,790 B2 | 1/2007 | Henley et al. | |
| 7,226,825 B2 | 6/2007 | Anderson et al. | |
| 7,361,219 B2 | 4/2008 | Yoshizawa | |
| 2001/0003668 A1 | 6/2001 | Yanagita et al. | |
| 2001/0019153 A1 | 9/2001 | Sato et al. | |
| 2002/0000242 A1 | 1/2002 | Matushiita et al. | |
| 2002/0081823 A1 | 6/2002 | Cheung et al. | |
| 2002/0124791 A1 | 9/2002 | Ito | |
| 2003/0012925 A1 | 1/2003 | Gorrell | |
| 2003/0217603 A1 * | 11/2003 | Ishio | G01L 9/0054 73/754 |
| 2004/0191973 A1 | 9/2004 | Kawamura | |
| 2004/0245521 A1 | 12/2004 | Faris | |
| 2005/0186712 A1 | 8/2005 | Smith | |
| 2006/0057791 A1 | 3/2006 | Anderson et al. | |
| 2006/0131553 A1 | 6/2006 | Yamanaka et al. | |
| 2006/0174820 A1 * | 8/2006 | Yoshizawa | C30B 13/00 117/13 |
| 2008/0014714 A1 | 1/2008 | Bourdelle et al. | |
| 2008/0121278 A1 | 5/2008 | Ito et al. | |
| 2008/0128641 A1 | 6/2008 | Henley et al. | |
| 2008/0179547 A1 | 7/2008 | Henley | |
| 2008/0188011 A1 | 8/2008 | Henley | |
| 2008/0206962 A1 | 8/2008 | Henley et al. | |
| 2008/0245408 A1 | 10/2008 | Ito et al. | |
| 2009/0042369 A1 | 2/2009 | Henley | |
| 2009/0170298 A1 | 7/2009 | Brailove | |

\* cited by examiner

METHOD AND DEVICE FOR SLICING A SHAPED SILICON INGOT USING LAYER TRANSFER

CROSS-REFERENCE TO RELATED APPLICATION

This application is a continuation application of U.S. patent application Ser. No. 14/106,002, filed Dec. 13, 2013 now U.S. Pat. No. 9,460,908, which is a continuation of U.S. patent application Ser. No. 12/384,926, filed Apr. 10, 2009 now U.S. Pat. No. 8,623,137, which claims priority to U.S. Provisional Patent Application No. 61/051,344, filed May 7, 2008, all of which are incorporated by reference in their entirety herein for all purposes.

BACKGROUND OF THE INVENTION

The present invention relates generally to techniques for forming substrates using a layer transfer technique. More particularly, the present method and system provides a layer transfer process for slicing a single crystal silicon sheet from an shaped silicon ingot for a variety of applications including photovoltaic cells. Merely by example, the present invention provides a method of using preferential cleave planes in single crystal silicon with a patterned implant to produce single crystal silicon sheets in a highly efficient controlled cleaving process. But it will be recognized that the invention has a wider range of applicability.

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells often rely upon starting materials such as silicon. Such silicon is often made using either polysilicon (i.e. polycrystalline silicon) and/or single crystal silicon materials. These materials are often difficult to manufacture. Polysilicon cells are often formed by manufacturing polysilicon plates. Although these plates may be formed effectively in a cost effective manner, they do not possess optimum properties for highly effective solar cells. In particular, polysilicon plates do not exhibit the highest possible efficiency in capturing solar energy and converting the captured solar energy into usable electrical power. By contrast, single crystal silicon (c-Si) has suitable properties for high grade solar cells. Such single crystal silicon is, however, expensive to manufacture and is also difficult to use for solar applications in an efficient and cost effective manner.

Additionally, both polysilicon and single-crystal silicon materials suffer from material losses during conventional manufacturing single crystal silicon substrates, where a sawing process is used to physically separate thin single crystal silicon layers from a single crystal silicon ingot originally grown. For example, inner diameter (ID) sawing process or wire sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

To overcome drawbacks of using silicon materials, thin-film solar cells have been proposed. Thin film solar cells are often less expensive by using less silicon material or alternative materials but their amorphous or polycrystalline structure are less efficient than the more expensive bulk silicon cells made from single-crystal silicon substrates. These and other limitations can be found throughout the present specification and more particularly below.

From the above, it is seen that techniques to manufacture suitable high quality single crystal silicon sheets with low cost and high productivity are highly desired.

BRIEF SUMMARY OF THE INVENTION

The present invention relates generally to techniques for forming substrates using a layer transfer technique. More particularly, the present method and system provides a layer transfer process for slicing a single crystal silicon sheet from an shaped silicon ingot for a variety of applications including photovoltaic cells. Merely by example, the present invention provides a method of using preferential cleave planes in single crystal silicon with a patterned implant to produce single crystal silicon sheets in a highly efficient controlled cleaving process. But it will be recognized that the invention has a wider range of applicability.

In a specific embodiment, the present invention provides a method for slicing a shaped silicon ingot. The method includes providing a single crystal silicon boule characterized by a cropped structure including a first end-face, a second end-face, and a length along an axis in an <100> crystallographic direction substantially vertically extending from the first end-face to the second end-face. The method further includes cutting the single crystal silicon boule substantially through an {110} crystallographic plane in parallel to the axis to separate the single crystal silicon boule into a first portion with a first surface and a second portion with a second surface. Additionally, the method includes exposing either the first surface of the first portion or the second surface of the second portion. Moreover, the method includes performing a layer transfer process to form a single crystal silicon sheet from either the first surface of the first portion or from the second surface of the second portion. In an embodiment, the layer transfer process includes one or more implanting process and one or more cleaving process which can be repeated in a successive manner to produce a plurality of single crystal silicon sheets with surfaces in {110} crystallographic planes.

In another specific embodiment, the present invention provides a method for slicing a shaped silicon ingot. The method includes providing a single crystal silicon ingot characterized by a cropped structure including a first end-face, a second end-face, and a length along an axis in an <110> crystallographic direction substantially vertically extending from the first end-face to the second end-face. The method further includes clamping the single crystal silicon ingot near a vicinity of the second end-face. Additionally, the method includes determining a first side associated with a first edge thickness from the first end-face to a first {1110} crystallographic plane and a second side associated with a second edge thickness from the first end-face to the first {110} crystallographic plane. The first end-face is off a miscut angle from the first {110} crystallographic plane and the first edge thickness is smaller than the second edge thickness. The method further includes applying a patterned ion-implantation at the vicinity of the first side to form a first cleave region at substantially the first edge thickness below the first end-face. Moreover, the method includes cleaving a layer of single crystal silicon material from the first side to the second side through the first {110} crystallographic plane initiated at the first cleave region. The method further includes applying a patterned ion-implantation at the vicinity of the second side to form a second cleave region at a predetermined thickness below the first {110} crystallographic plane. Furthermore, the method includes cleaving a single crystal silicon sheet from the second side to the first side through a second {110} crystallographic plane initiated at the second cleave region. The second {110} crystallographic plane is in parallel to the first {110} crystallographic plane.

In yet another specific embodiment, the present invention provides a method for slicing a shaped silicon boule. The method includes providing a single crystal silicon boule characterized by a cropped structure including a first end-face, a second end-face, and a length along an axis in an <110> crystallographic direction substantially vertically extending from the first end-face to the second end-face. The method further includes cutting the single crystal silicon boule substantially along an {111} crystallographic plane in parallel to the axis to form a first portion with a first surface. The first surface is off a miscut angle from the {111} crystallographic plane. Additionally, the method includes determining a first side associated with a first edge thickness from the first surface to a first {111} crystallographic plane within the first portion and a second side associated with a second edge thickness from the first surface to the first {111} crystallographic plane. The first edge thickness is smaller than the second edge thickness. The method further includes performing a first implanting process to form a first cleave region near a vicinity of the first side at the first edge thickness below the first surface. Moreover, the method includes performing a first cleaving process to remove a layer of single crystal silicon material from the first side to the second side through the first {111} crystallographic plane. The first cleaving process is initiated at the first cleave region. The method further includes performing a second implanting process to form a second cleave region near a vicinity of the second side at a predetermined thickness below the first {111} crystallographic plane. Furthermore, the method includes performing a second cleaving process to remove a single crystal silicon sheet through a second {111} crystallographic plane, the second cleaving process being initiated at the second cleave region.

Many benefits can be obtained by implementing the present invention. For typical single crystal silicon ingot grown with an axis in <100> crystallographic direction, the present invention provides a method to form a portion of silicon ingot or boule with a surface substantially in an {110} type plane. This portion of silicon boule with such a surface can be used to produce a plurality of single crystal silicon sheets in substantially squared shape by an advanced layer transfer process. Taking advantage of the easier-cleave characteristic of {110} type plane, the layer transfer process can be performed with lower ion dose in a patterned ion-implantation process and higher yield in subsequent cleaving process. The resulted single crystal silicon sheet with {110} surface plane can have much lower surface roughness than a sheet cleaved from (100) plane. In addition, for silicon ingot grown in <110> direction, instead of one way to cleave layers of single crystal silicon material from an {110} plane, a plurality of single crystal silicon sheet with an {111} surface plane can be produced according embodiments of the present invention. In fact, {111} plane is the best cleave plane for single crystal silicon. Additionally, the single crystal silicon sheets with {110} or {111} type surface planes formed according to embodiments of the present invention can be further processed to form one or more photovoltaic regions on the {110} or {111} type planes. The resulted process conditions are similar to those for substrates with (100) surface planes, while the overall manufacture cost is reduced. Particularly, when compared to multi-crystal silicon substrate used for typical photovoltaic cells the single crystal silicon sheet substrate provides much better quality in terms of surface roughness, surface cleanliness, line-width for metallization, cell consistency in electrical characteristics, and the overall lifetime and light-conversion efficiency (20% vs. 15%), and at the same time with even lower cost per wafer. Some embodiments of the invention can utilize the existing manufacture processing systems and techniques as well as take some advantage of certain newly developed techniques for manufacturing thin wafer/substrate for various semiconductor device applications. More details about various embodiments of the present invention can be found in the description below.

DETAILED DESCRIPTION OF THE INVENTION

The present invention relates generally to techniques for forming substrates using a layer transfer technique. More particularly, the present method and system provides a layer transfer process for slicing a single crystal silicon sheet from an shaped silicon ingot for a variety of applications including photovoltaic cells. Merely by example, the present invention provides a method of using preferential cleave planes in single crystal silicon with a patterned implant to produce single crystal silicon sheets in a highly efficient controlled cleaving process. But it will be recognized that the invention has a wider range of applicability.

As background, for a typical single crystal silicon ingot used for manufacturing wafer substrates, it is usually grown along an <100> crystallographic axis with an end facet being an {100} crystallographic plane. The wafer substrates produced by slicing the ingots thus have a surface substantially in an {100} crystallographic plane with a certain miscut angle. However, {100} crystallographic plane is not a stable cleave plane which usually will branch into an {110} and an {111} plane, as we discovered. A solution is to increase ion dose and extend the implanting area during the implanting process to create a cleave region that is more susceptible for cleaving. However, it still causes higher surface roughness, more cost with high ion dose and less productivity, and perhaps lower yield when slicing the <100> orientation ingot in convention manner. Depending upon the embodiment, these and other limitations are overcome using the present method and structures.

Figure 1:
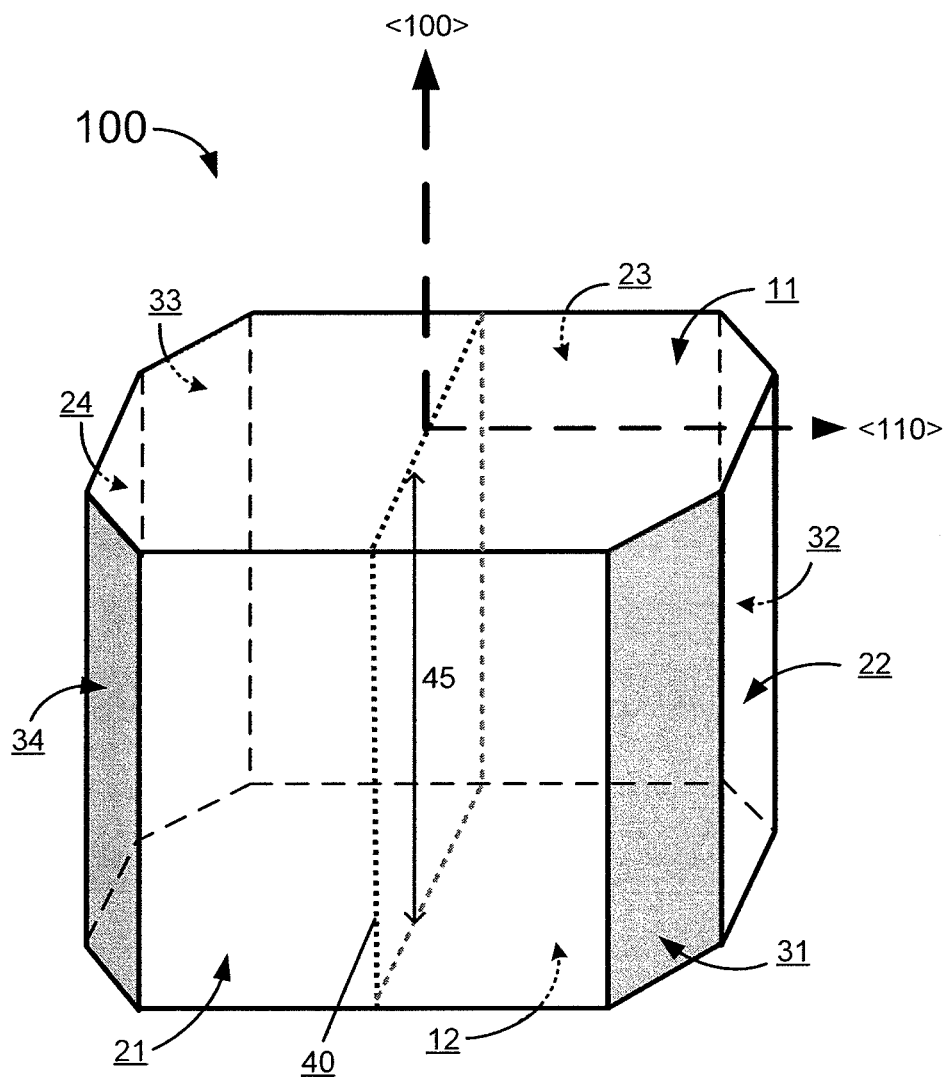
FIG. 1 is a simplified diagram of a shaped single crystal silicon boule with a long axis in an <100> crystallographic direction vertically extending from two end-faces provided according to an embodiment of the present invention.

FIG. 1 is a simplified diagram of a shaped single crystal silicon boule with a long axis in an <100> crystallographic direction vertically extending from two end-faces provided according to an embodiment of the present invention. This diagram is merely an example, which should not unduly limit the scope of the claims herein. One of ordinary skill in the art would recognize many variations, alternatives, and modifications. As shown, a shaped single crystal silicon boule 100 is a cylinder with an axis in an <100> crystallographic direction, including two end-faces 11 and 12, four major side-faces 21, 22, 23, and 24, and four minor side-faces (or corner faces) 31, 32, 33, and 34. The two end-faces 11 and 12 are substantially perpendicular to the axis, so that each of them basically is one of {100} crystallographic plane. For example, if the axis is in [100] direction, the end-face should be in (100) plane. The side planes are also substantially in parallel to the axis. For example, if the axis is in [100] direction, the four major side-faces can be in one of {110} crystallographic planes. The single crystal silicon boule 100 also includes a length 45 defined as a distance between the two end-faces 11 and 12. In one embodiment, when cropping a single crystal silicon ingot to provide the boule 100 structure, the cropping/cutting process controls can be done precisely to have both the side-faces and the end-faces being substantially along certain crystallographic planes as mentioned and to have the length 45 of the boule being substantially equal to a lateral dimension of the end-face. Of course, there can be many alternatives, variations, and modifications.

Figure 2:
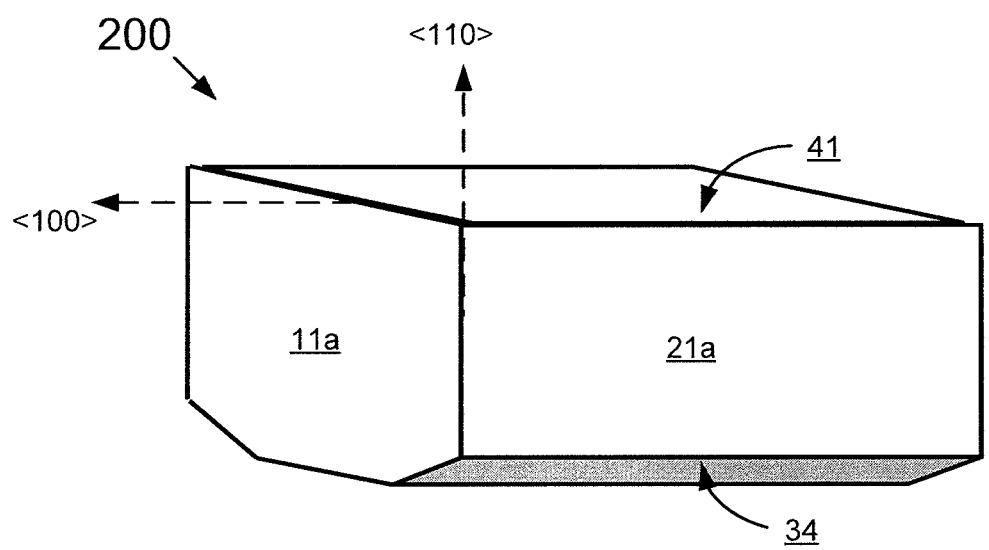
FIG. 2 is a simplified diagram of a portion of the shaped single crystal silicon boule obtained by cutting along a plane in FIG. 1 to expose a surface substantially in an {110} crystallographic plane according to an embodiment of the present invention.

Additionally, FIG. 1 also shows that a virtual middle plane, as indicated by number 40, across the two end-faces 11 and 12 along the axis <100> can be in one of {110} crystallographic plane and selected as a cutting plane. A wire saw process can be applied to cut the boule 100 through the selected cutting plane 40 to separate the boule 100 into two portions. FIG. 2 is a simplified diagram of a portion of the shaped single crystal silicon boule obtained by cutting along a plane in FIG. 1 to expose a surface substantially in an {110} crystallographic plane according to an embodiment of the present invention. This diagram is merely an example, which should not unduly limit the scope of the claims herein. One of ordinary skill in the art would recognize many variations, alternatives, and modifications. As shown, the portion 200 forms after cutting the single crystal silicon boule 100 through the plane 40. Two end-faces 11 and 12 of boule 100 now become side face 11a and side face 12a (12a is not directly viewable in FIG. 2) and two side faces 21 and 23 now are cut with portions 21a and 23a left (again 23a is not directly viewable). In particular, the portion 200 includes a newly formed surface 41 by cutting through the plane 40. The surface 41 is in substantially a squared shape. In a specific embodiment, the surface 41 can be used as a base plane for further slicing a plurality of single crystal silicon films/substrates in an advanced layer transfer process. In another specific embodiment, the minor side face 34 (and 33, not directly viewable) can be used for clamping the portion 200 during the layer transfer process.

In conventional wafer manufacturing processes, wafer substrates for various semiconductor industrial applications including photovoltaic cells are vertically sliced one by one from the end-face of the single crystal silicon ingots or boules. If the long axis of the ingot is along <100> crystallographic direction, the wafer substrate obtained would have a surface substantially in an {100} crystallographic plane. Usually, the cutting is imperfect so that the surface actually is off a miscut angle from the {100} plane along a certain direction (for example, a [110] direction). Typically, the miscut angle is within 0 to 2 degrees. Embodiments of the present invention suggests an alternate approach to prepare the single crystal silicon boule to be used for slicing wafer/substrates from. By cutting the boule 100 with a long axis in <100> direction into two portions along a predetermined plane 40 in {100} plane, each of two resulting portions provides a new surface substantially in an {110} crystallographic plane rather than a {100} plane. In particular, the new surface has a substantially squared shape if the single crystal silicon boule 100 is properly provided. Also, the new surface may be off the {110} crystallographic plane by a small miscut angle within 0 to 2 degrees. In a specific embodiment, this new surface is more suitable for forming a plurality of shaped silicon sheet materials by slicing the portion 200 one by one using an advance layer transfer process developed by a co-inventor, which greatly reduces the kerf-loss compared to the conventional wafer cutting techniques. More details of the layer transfer process can be found in a co-assigned U.S. patent application Ser. No. 11/935,197 by Francois J Henley et al., and titled "METHOD AND STRUCTURE FOR THICK LAYER TRANSFER USING A LINEAR ACCELERATOR", filed on Nov. 5, 2007. More descriptions and the advantages of the layer transfer process utilizing {110} crystallographic plane can be found throughout this specification and specifically below.

Figure 3A:
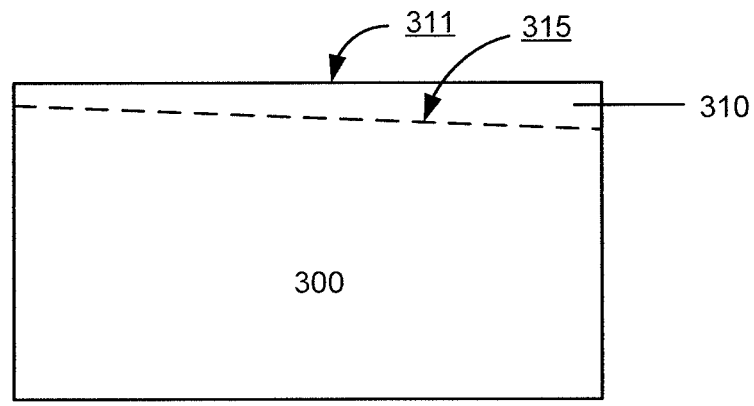
FIGS. 3A-3F are simplified diagrams showing a layer transfer process performed on an exposed single crystal silicon surface according to an embodiment of the present invention.

FIGS. 3A-3F are simplified diagrams showing a layer transfer process performed on an exposed single crystal silicon surface according to an embodiment of the present invention. These diagrams are merely examples, which should not unduly limit the scope of the claims herein. One of ordinary skill in the art would recognize many variations, alternatives, and modifications. As shown in FIG. 3A, a cross section of a single crystal silicon boule 300 includes an exposed surface 311, while the opposite surface may be clamped on a stage within a system (not shown) configured to perform a layer transfer process. Also shown, the single crystal silicon boule 300 includes a crystallographic plane 315 located in certain depth below the surface 311, forming a layer 310 of single crystal silicon material located near the top portion of the silicon boule 300. For example, the plane 315 is an {110} crystallographic plane or an {111} crystallographic plane. In one example, the surface 311 is the created surface 41 of the cut portion 200 of the single crystal silicon boule 100. Due to a small miscut angle between the surface 311 and the crystallographic plane 315, the layer 310 has an edge side with a thinner edge thickness and an opposite edge side with a thicker edge thickness, as shown in FIG. 3A. In one embodiment, the edge side with thinner edge thickness can be identified using an X-ray diffraction and other techniques.

Figure 3B:
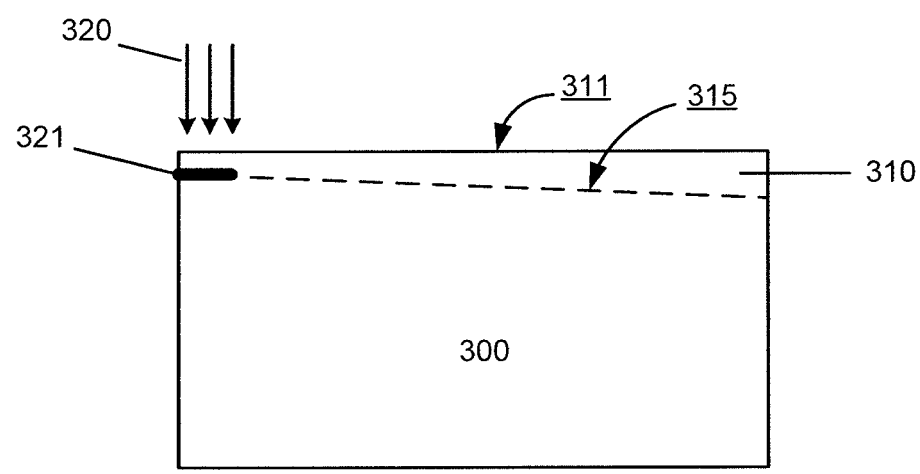

After the edge side with thinner edge thickness is identified, the exposed surface of the single crystal silicon boule (or a portion of it) can be applied with a first ion-implanting process. In particular, the first ion-implanting process is a patterned implantation process with only the vicinity of the edge side with the thinner edge thickness exposed to an ion beam. As shown in FIG. 3B, an ion beam 320 is introduced to irradiate an area near the vicinity of the edge side identified with a thinner edge thickness. In one embodiment, the ion beam 320 is introduced from above the surface 311 in a substantially vertical angle. In another embodiment, the ion beam 320 is generated by a RFQ or RFI based linear accelerator system to possess an energy level about 1-5 MeV and well controlled other parameters including beam size, pulse rate, etc so that they can be implanted into the single crystal silicon boule 300 with a desired depth. In one example, the controlled ion beam 320 implants protons into a region at the thinner edge thickness below the surface 311, where a cleave region 321 is formed. Referring to the co-assigned U.S. patent application Ser. No. 11/935,197 by Francois J Henley et al., and titled "METHOD AND STRUCTURE FOR THICK LAYER TRANSFER USING A LINEAR ACCELERATOR", filed on Nov. 5, 2007, more details about the ion-implanting process as well as the formation of the cleave region can be found. In particular, this cleave region includes a local defect network that is susceptible of initiating a bond-breaking cleavage process such as a Controlled Cleave Process (CCP) developed by a co-inventor.

Figure 3C:
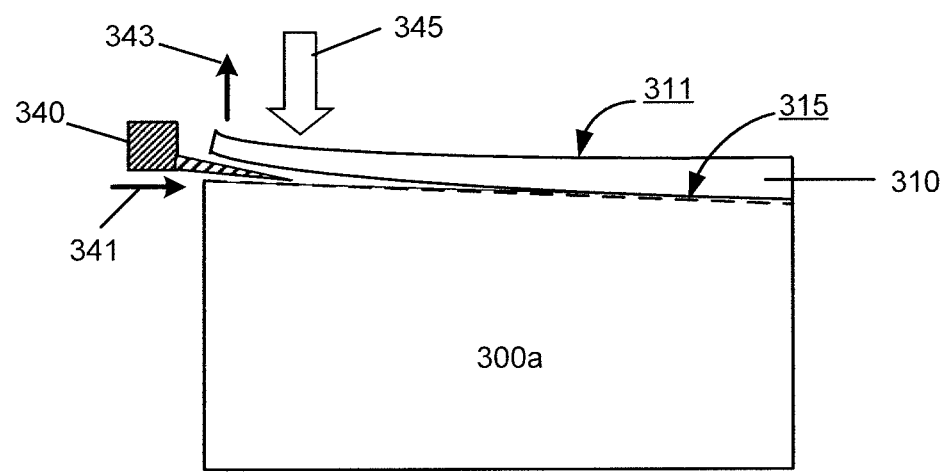

In one embodiment, FIG. 3C shows a first cleaving process is performed. As shown, the first cleaving process is initiated at the cleave region 321 and utilized a blade 340 with sharp edge to push into a gap created from the cleave region 321. As mentioned above, the cleave region 321 is at the thinner edge thickness which becomes part of the crystallographic plane 315. In one embodiment, the first cleaving process includes pushing the blade 340 through the crystallographic plane 315 from the edge side with thinner edge thickness to the opposite edge side with thicker edge thickness. For example, the blade is coupled to a robot system that allows the pushing process to be under controlled. In another embodiment, the process of pushing blade through is accompanied with another process of pulling film up to lift the layer 310 from the portion above the inserted blade edge. For example, a vacuum chucking or electrostatic chucking method can be applied to lift the layer 310 away from the remaining silicon boule portion 300a in the pulling film up process. In yet another embodiment, the first cleaving process is assisted by applying ultrasonic and mechanical energy for both the process of pushing blade through and the process of pulling film up.

Figure 3D:
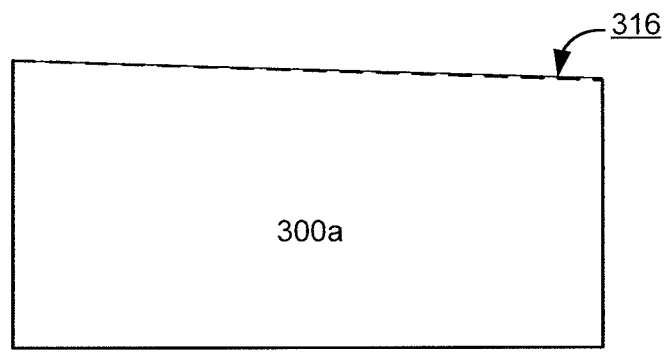

In a specific embodiment, the first cleaving process with the assistance of ultrasonic mechanical energy is able to break atomic bonds along certain crystallographic planes that cost the least energy. For single crystal silicon, the lower surface energy of {111} type plane, followed by {110} type plane, is the best cleave plane. While the {100} type plane is not a stable cleave plane because it can branch to corresponding (110) and (111) plane sections, resulting a much higher roughness and lower cleave yield. Therefore, as the crystallographic plane 315 is selected to be an {110} plane or an {111} plane, the first cleaving process through the plane 315 as proceeding in FIG. 3C would result a removal of the layer 310 and create a new surface 316 for the remaining portion of silicon boule 300a. FIG. 3D provides a cross section view of the remaining silicon boule 300a with a newly formed surface 316 by the first cleaving process after the layer 310 is removed. In one embodiment, the newly formed surface 316 is substantially the same crystallographic plane as the plane 315. For example, the surface 316 can be an {110} crystallographic plane or an {111} crystallographic plane, depending on how the silicon boule 300 is provided. Of course, there are many alternatives, variations, and modifications.

Figure 3E:
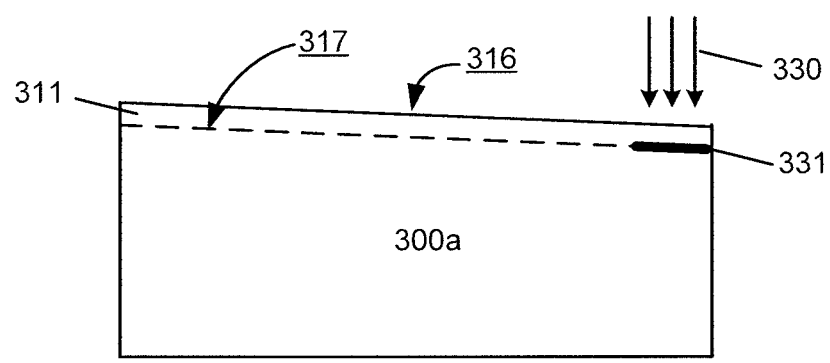

FIG. 3E shows that the remaining portion 300a with an exposed surface 316 is ready for a second ion-implanting process. In one embodiment, the second ion-implanting process is another patterned ion-implantation process substantially the same as the first ion-implanting process. As shown, an ion beam 330 is introduced to irradiate an area near the vicinity of the edge side that was associated with a thicker edge thickness before removal of the layer 310. The patterned ion-implantation causes a formation of a cleave region 331 at a thickness below the surface 316. The thickness can be controlled by adjusting the parameters of ion-beam 330. In one embodiment, the thickness is a distance between the surface 316 and a plane 317. The plane 317 is a same type crystallographic plane as the surface 316 and is in parallel to the surface 316. For example, either plane 317 or surface 316 is an (110) plane. In another example, both plane 317 and surface 316 are a (−11-1) plane belonging to the {111} plane family. As shown in FIG. 3E, a cleave region 331 is formed by the second ion-implanting process to associate the plane 317 and a top layer 311 with the thickness of single crystal silicon material between the surface 316 and the plane 317 is defined on top of the silicon boule portion 300a.

Figure 3F:
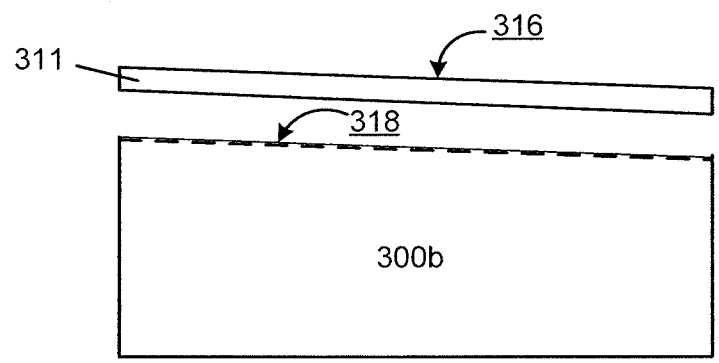

In one embodiment, the silicon boule portion 300a with the cleave region 331 is further subjected to a second cleaving process initiated for the cleave region 331. In another embodiment, the second cleaving process is substantially the same as the first cleaving process, resulting a removal of the layer 311 from the silicon boule portion 300a through the crystallographic plane 317. FIG. 3F shows a remaining silicon boule portion 300b after the layer 311 is removed, revealing a new surface 318 for the silicon boule portion 300b. In one embodiment, the removed layer 311 is a shaped single crystal silicon sheet with surfaces substantially the same as predetermined crystallographic plane 317 or plane 316 and a substantially a squared shape. For example, the crystallographic plane type can be {110} or {111} as desired. In another example, the shaped single crystal silicon sheet can be applied for various semiconductor device applications including photovoltaic cells. The thickness of the shaped single crystal silicon sheet can be formed in a range from 20 microns to 180 microns for different applications. In yet another embodiment, the newly remaining silicon boule portion 300b can be further subjected for a series of combinations of ion-implanting process and cleaving process in a successive manner so that a plurality of the shaped single crystal silicon sheets (like the layer 311) can be produced.

Figure 4:
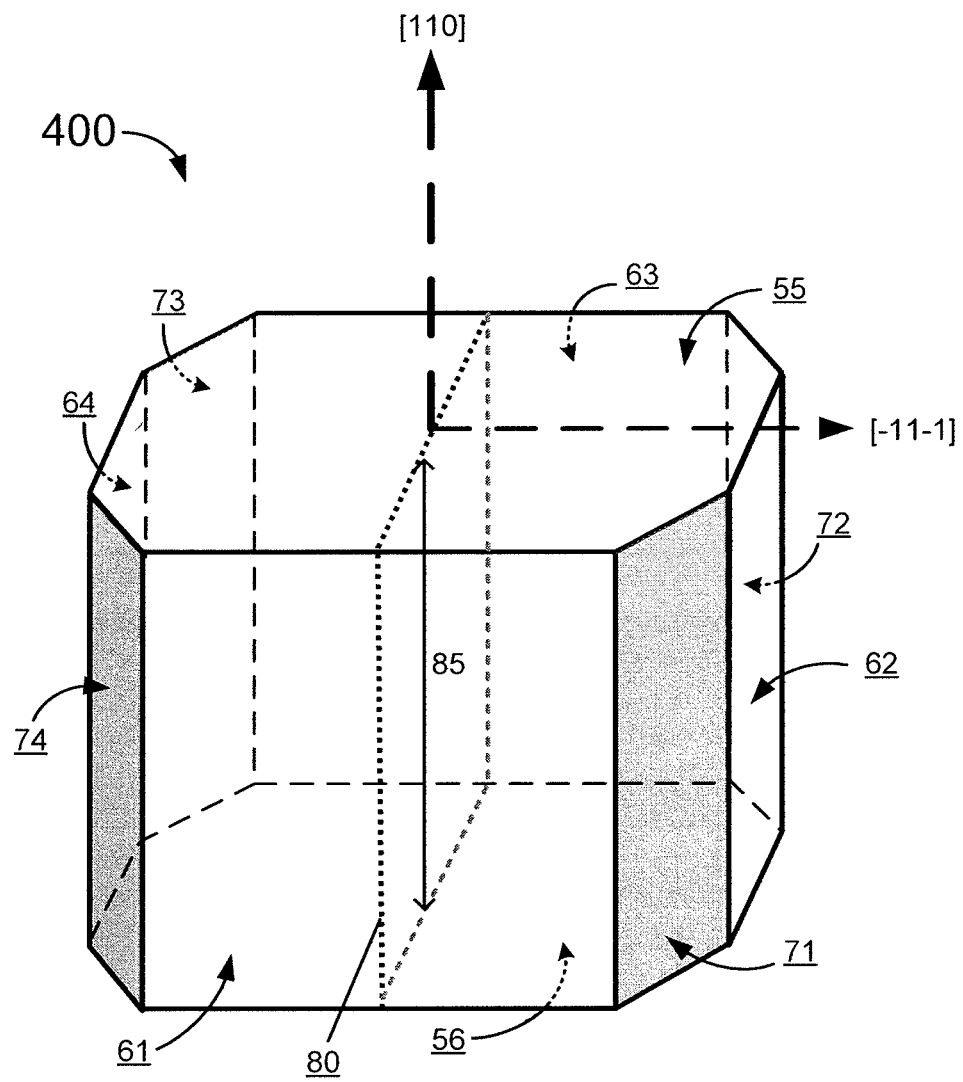
FIG. 4 is an exemplary diagram of a shaped single crystal silicon boule with a long axis in an [110] crystallographic direction vertically extending from two end-faces provided according to an embodiment of the present invention.

In one embodiment, the shaped single crystal silicon ingot or boule can be provided with different orientations. For example, depending on the use of different seed crystal, the single crystal silicon ingot can be produced using an ingot growth process, such as a Czochralski process, to have its long axis in either <100> crystallographic direction, or <110> direction, or <111> direction, or others. After proper side cropping and end cutting, a single crystal silicon boule that is similar to but different from the silicon boule 100 can be provided and commonly available from the single crystal silicon manufacturers. FIG. 4 is an exemplary diagram of a shaped single crystal silicon boule provided with a long axis in an [110] crystallographic direction vertically extending from two end-faces according to an embodiment of the present invention. This diagram is merely an example, which should not unduly limit the scope of the claims herein. One of ordinary skill in the art would recognize many variations, alternatives, and modifications.

As shown in FIG. 4, a shaped single crystal silicon boule 400 is a cylinder with an axis in [110] crystallographic direction, including two end-faces 55 and 56, four major side-faces 61, 62, 63, and 64, and four minor side-faces (or corner faces) 71, 72, 73, and 74. The two end-faces 55 and 56 are substantially perpendicular to the [110] axis, so that each of them basically is in the (110) crystallographic plane. The side-faces are also substantially in parallel to the axis. In particular, a major side-face 62 is preferably selected to be in (−11-1) plane. Another major side-face 64 is in parallel to side-face 62. The other two major side-faces 61 and 63 are in parallel to each other but perpendicular to the major side-face 62. As shown, the crystallographic direction [−11-1] is perpendicular to the side-face 62 and also perpendicular to the crystallographic direction [110] of the axis. Thus, a middle cross section plane 80, which contains the long axis and perpendicular to the [−11-1] direction, should also be in a plane belonging to {111} family. Additionally, the single crystal silicon boule 400 includes a length 85 defined as a distance between the two end-faces 55 and 56. In one embodiment, when cropping a single crystal silicon ingot to provide the boule 400 structure, the cropping/cutting process controls can be done to have the length 85 of the silicon boule 400 being substantially equal to a lateral dimension of the end-face 55 or the cross section plane 80.

Figure 5A:
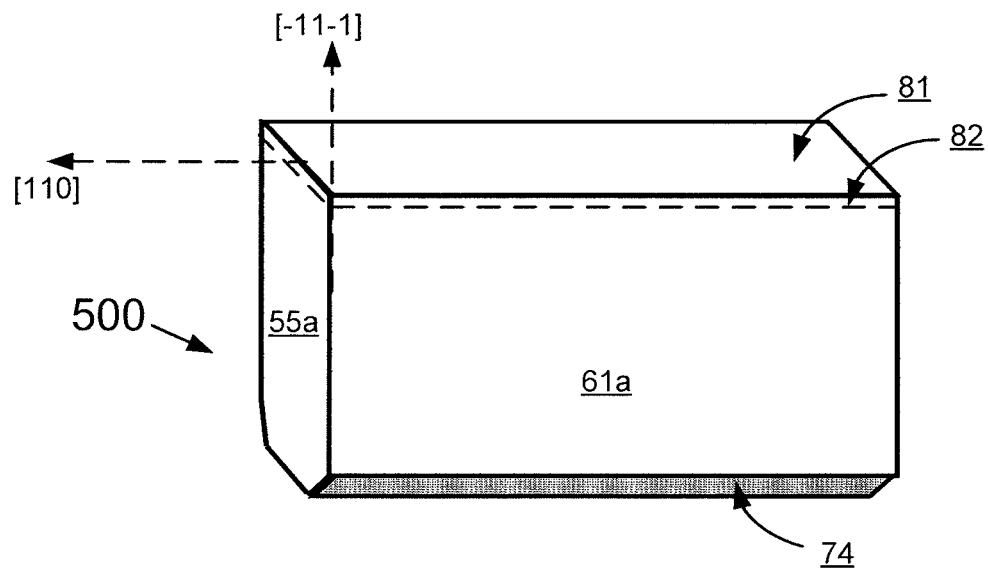
FIG. 5A is a simplified diagram showing a portion of the shaped single crystal silicon boule with a surface substantially in an {111} type plane according to an embodiment of the present invention.

In one embodiment, the single crystal silicon boule 400 as provided can be cut along the cross section plane 80 to form two portions each with a new surface that is substantially in a crystallographic plane belong to {111} family. The resulting portion with the new surface exposed for performing a layer transfer process to produce one or more shaped sheet material having an alternative crystallographic plane than conventional (110) plane. FIG. 5A is a simplified diagram showing a portion of the shaped single crystal silicon boule with a surface substantially in an {111} type plane according to an embodiment of the present invention. This diagram is merely an example, which should not unduly limit the scope of the claims herein. One of ordinary skill in the art would recognize many variations, alternatives, and modifications. As shown, the silicon boule portion 500 includes a top surface 81 and two end-faces (one end-face 55a is visible and an opposite one is not visible in FIG. 5A) as well as several other side-faces. In one embodiment, the silicon boule portion 500 can be obtained by cutting the single crystal silicon boule 400 along the middle cross section plane 80. Therefore, the top surface 81 is created from the cross section plane 80, and the end-face 55a is part of the original end-face 55 and the side-face 61a is part of original side-face 61. As indicated by the directional arrow, the surface 81, which is substantially perpendicular to the [−11-1] direction, is substantially in (−11-1) plane which belongs to {111} plane family. Of course, there can be many alternatives, variations, and modifications. For example, there can be a miscut angle, typically within 0 to 2 degrees, between the surface 81 and the (−11-1) crystallographic plane.

Figure 5B:
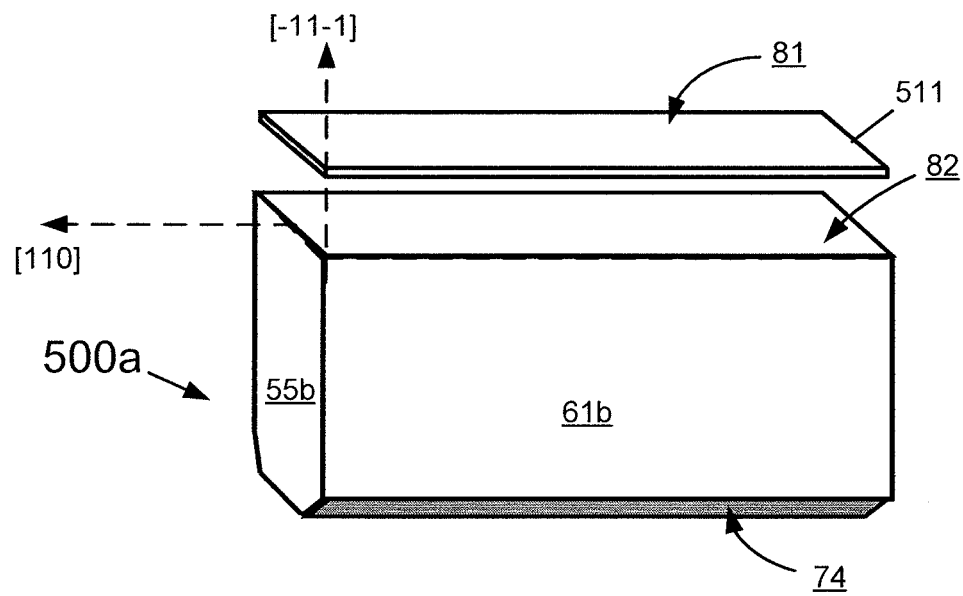
FIG. 5B is a simplified diagram showing a single crystal silicon sheet with {111} planes being removed from the portion shown in FIG. 5A by a layer transfer process according to an embodiment of the present invention.

FIG. 5B is a simplified diagram showing a single crystal silicon sheet with {111} planes being removed from the portion shown in FIG. 5A by a layer transfer process according to an embodiment of the present invention. This diagram is merely an example, which should not unduly limit the scope of the claims herein. One of ordinary skill in the art would recognize many variations, alternatives, and modifications. In one embodiment, the layer transfer process performed on the portion 500 is substantially the same as that described in FIGS. 3A-3F. In a specific embodiment, the cleaving process is performed to remove a shaped sheet material 511 through an {111} crystallographic plane. In another embodiment, the shaped sheet material is a substantially a squared shape having a thickness between a front surface and a back surface which are both in parallel to a substantially {111} crystallographic plane. For example, the {111} plane is the (−11-1) plane in FIG. 5B. After removing the shaped sheet material, the silicon boule portion 500 becomes a silicon boule portion 500a with a newly created surface 82 which is also substantially in a plane belonging to {111} family. In a successive manner, the layer transfer process can be further applied to the silicon boule portion 500a to continue producing more single crystal silicon sheets like the shaped sheet material 511.

Figure 6:
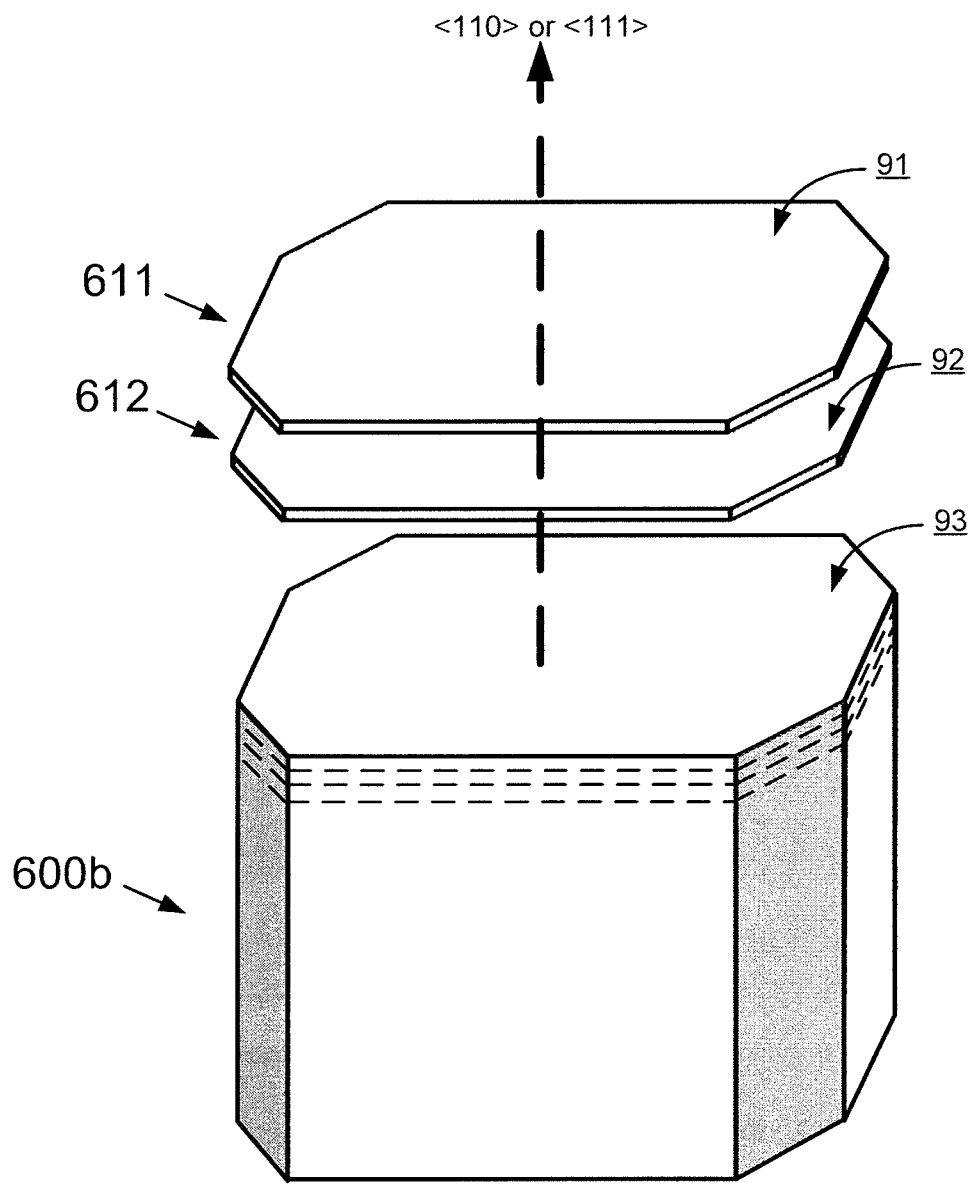
FIG. 6 is a simplified diagram showing one or more single crystal silicon sheets being sliced from the end-face of a shaped single crystal silicon ingot in an <110> or <111> crystallographic direction according to an embodiment of the present invention.

In an alternative embodiment, the provided single crystal silicon boule has a long axis in either <110> or <111> crystallographic direction extending vertically through two end-faces. Thus the two end-faces can be substantially in {110} or {111} crystallographic planes, which automatically become the base plane for layer transfer process because both type of crystallographic planes are preferred for cleaving. FIG. 6 is a simplified diagram showing one or more single crystal silicon sheets being sliced from the end-face of a shaped single crystal silicon ingot in an <110> or <111> crystallographic direction according to an embodiment of the present invention. This diagram is merely an example, which should not unduly limit the scope of the claims herein. One of ordinary skill in the art would recognize many variations, alternatives, and modifications. As shown, a shaped sheet material 611 is formed with a surface 91 substantially in an {110} or {111} crystallographic plane. Following that, another shaped sheet material 612 is formed with a surface 92 substantially also in an {110} or {111} crystallographic plane. The remaining portion 600b of the single crystal silicon ingot has a surface 93 still substantially in an {110} or {111} crystallographic plane. In one embodiment, the slicing process to form one or more shaped sheet material out of the single crystal silicon ingot is performed by a layer transfer process described in FIGS. 3A-3F. In a specific embodiment, the formed shaped sheet material has a thickness in a range of 20 microns to 180 microns for various semiconductor device applications including photovoltaic cells. For example, for each of the f shaped sheet material, one or more photovoltaic regions can be formed on the {110} or {111} crystallographic planes.

Figure 7:
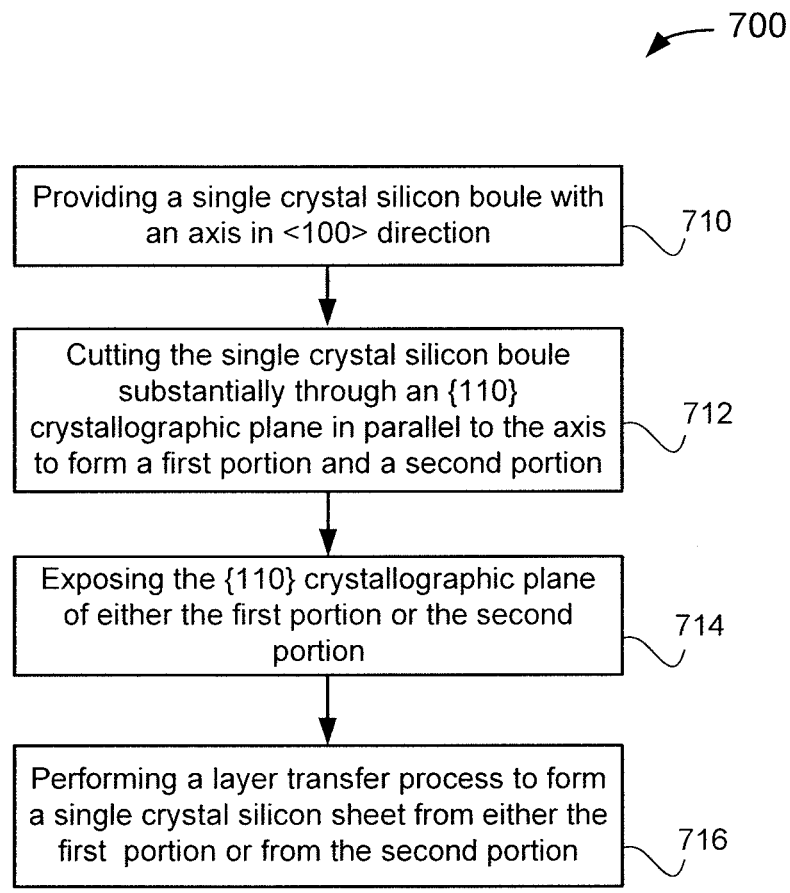
FIG. 7 is a simplified flowchart showing a method of slicing a shaped crystal ingot according to an embodiment of the present invention.

FIG. 7 is a simplified flowchart summarizing a method of slicing a shaped crystal ingot according to an embodiment of the present invention. This diagram is merely an example, which should not unduly limit the scope of the claims herein. One of ordinary skill in the art would recognize many variations, alternatives, and modifications. As shown, the method 700 includes a process of providing a single crystal silicon boule with an axis in <100> direction (Process 710). Additionally, the single crystal silicon boule may be cut from an ingot to have a first end-face and a second end-face substantially in {100} crystallographic plane and have a length between the first end-face and the second end-face. Additionally, the single crystal silicon boule can be cropped on its sides along certain crystallographic planes. For example, the cropping crystallographic planes can be selected from the {110} plane family. In one example, two opposite cropped side planes are in (110) planes and other two opposite cropped side planes are in (−110) planes so that the single crystal silicon boule becomes the silicon boule 100 shown in FIG. 1 with its cross-section in a substantially squared shape (excepting for chopped corners). In another example, the cutting method used here can be conventional ID sawing or wire sawing method.

FIG. 7 further shows a process (712) of the method 700 to cut the single crystal silicon boule substantially through an {110} crystallographic plane in parallel to the axis to form a first portion and a second portion. In a specific embodiment, either the first portion or the second portion has a newly created surface by cutting through the {110} crystallographic plane. The newly created surface is substantially in the {110} crystallographic plane, with a possibly small miscut angle towards a certain direction due to imperfect cutting. Typically, the miscut angle can be within 2 degrees. This cutting can still be performed using conventional wire sawing method.

Now the newly created surface that is substantially parallel to an {110} crystallographic plane can be exposed (Process 714) and aligned to certain direction when either the first portion or the second portion is properly clamped on a processing stage. For example, the portion 200 is used with its surface 41 being exposed and the minor side face 34 being used for clamping. Subsequently, a layer transfer process can be performed on either the first portion or the second portion to form a single crystal silicon sheet from the exposed surface (Process 716). In a specific embodiment, the layer transfer process includes a series of steps described in FIGS. 3A-3F. In particular, the single crystal silicon sheet removed from either the first portion or the second portion includes surfaces in {110} crystallographic planes which are relatively easier to be cleaved according to certain embodiments of the present invention. In another embodiment, the formed single crystal silicon sheets with {110} planes have a squared shape providing a more efficient module area utilization for manufacture of photovoltaic cells.

Figure 8:
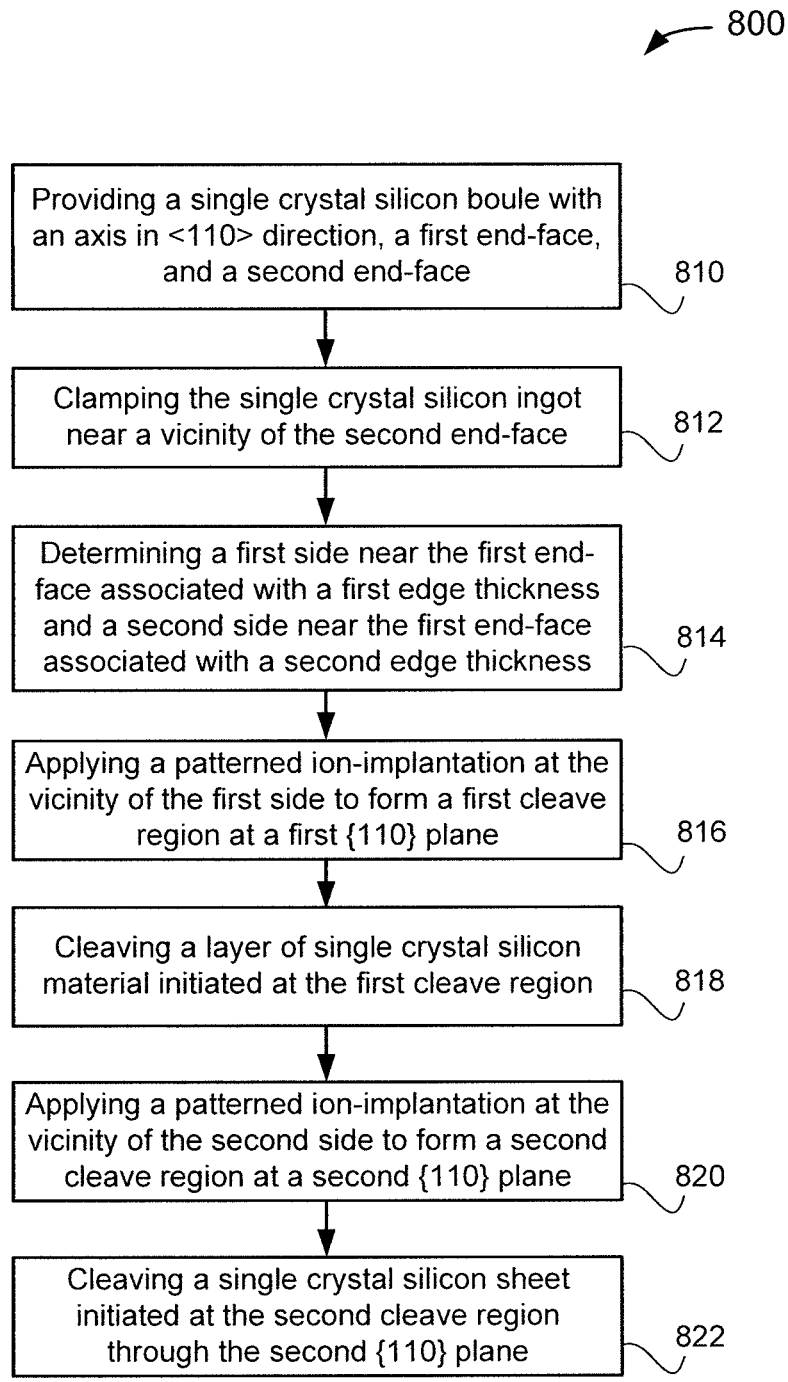
FIG. 8 is a simplified flowchart showing a method of slicing a shaped crystal ingot according to another embodiment of the present invention.

FIG. 8 is a simplified flowchart showing a method of slicing a shaped crystal ingot according to another embodiment of the present invention. This diagram is merely an example, which should not unduly limit the scope of the claims herein. One of ordinary skill in the art would recognize many variations, alternatives, and modifications. As shown, the method 800 includes a process of providing a single crystal silicon ingot with an axis in <110> direction, a first end-face, and a second end-face (Process 810). In this process, an silicon ingot can be grown specifically along an <110> crystallographic direction. Then the ingot is cut along a first cross section plane substantially perpendicular to the <110> direction to have a first end-face and cut along a second cross section plane substantially perpendicular to the <110> direction to have a second end-face. The cutting method can be simply a conventional ID sawing or a wire sawing technique. In a specific example, the ingot is a silicon boule 400 shown in FIG. 4 with an axis in [110] direction and end-faces in (110) plane.

The method 800 then includes a process (812) of clamping the single crystal silicon ingot near a vicinity of the second end-face. This process is for preparing the silicon ingot for subsequent processes to be performed near the first end-face. Firstly, a process (814) of determining a first side near the first end-face associated with a first edge thickness and a second side near the first end-face associated with a second edge thickness is carried out. The first edge thickness is defined as a thickness, near a first side edge of the ingot, between the first end-face and a first {110} crystallographic plane below the first end-face. The second edge thickness is defined as a thickness, near a second side edge of the ingot, between the first end-face and the first {110} crystallographic plane below the first end-face. Due to the imperfect cutting (performed in process 810) the first end-face can be off a small miscut angle from the true {110} crystallographic plane. The miscut angle typically can be within 0 to 2 degrees towards a certain crystallographic direction. Therefore, the first edge thickness can be different from the second edge thickness due to the small miscut angle. In one example, the first edge thickness is smaller than the second edge thickness. In another example, the miscut angle is in an <110> crystallographic direction. In one embodiment, the determining the first side is based on identifying the edge thickness using an X-ray Diffraction method or similar techniques.

The method 800 further includes a process (816) of applying a first patterned ion-implantation at the vicinity of the first side to form a first cleave region at the first {111} plane below the first end-face. In one example, the first patterned ion-implantation can be performed following a step described partly in FIG. 3B. In particular, the first cleave region is located at a depth below the first end-face, where the depth is substantially equal to the first edge thickness identified in Process 814. Subsequently a first cleaving process (Process 818) can be performed to initiate an film cleavage at the first cleave region or cause a removal of a layer of single crystal silicon material from the first side to the second side through the first {110} crystallographic plane. The first cleave region becomes a starting site for inserting a blade with sharp edge which is gradually pushed through the first {110} crystallographic plane while the layer of single crystal silicon material is lifted or pulled up at the same time. In one embodiment, ultrasonic mechanical energy may be added to assist the blade-pushing and filmpulling-up processes. Additionally, air pressure can be injected through blade for proving further assistance to the cleaving process. In one example, the Process 818 is performed according to step described in FIG. 3C.

The first cleaving process (818) creates a new surface that is characterized by the first {110} crystallographic plane. Subsequently, a second patterned ion-implantation process (820) can be performed near the second side vicinity. In one embodiment, the second patterned ion-implantation results a formation of a second cleave region located at a depth below the newly created surface in the first {110} crystallographic plane. In another embodiment, the depth is associated with a second {110} crystallographic plane in parallel to the first {110} crystallographic plane. In yet another embodiment, the second patterned ion-implantation is substantially similar to the first patterned ion-implantation. In one example, the process 820 can be performed following the step described in FIG. 3E.

Finally, a second cleaving process (Process 822) can be performed to initiate a film cleavage from the second cleave region through the second {110} plane. In one embodiment, the second cleaving process is substantially similar to the first cleaving process. The result of the second cleaving process is a removal of a single crystal silicon sheet, which has a thickness determined by the depth of the second cleave region and a shape that is substantially the same as the cross-section of the silicon ingot. In a specific embodiment, the thickness of the single crystal silicon sheet can be controlled to be in a range of 20 microns to 180 microns depending on the applications. For example, the single crystal silicon sheet can be applied to make one or more photovoltaic regions directly on its surface in an {110} crystallographic plane. According to embodiments of the present invention, certain above processes, particularly the processes 816 through 822, can be repeated in a successive manner to produce a plurality of single crystal silicon sheets, each with a desired thickness and surfaces in an {110} plane.

Figure 9:
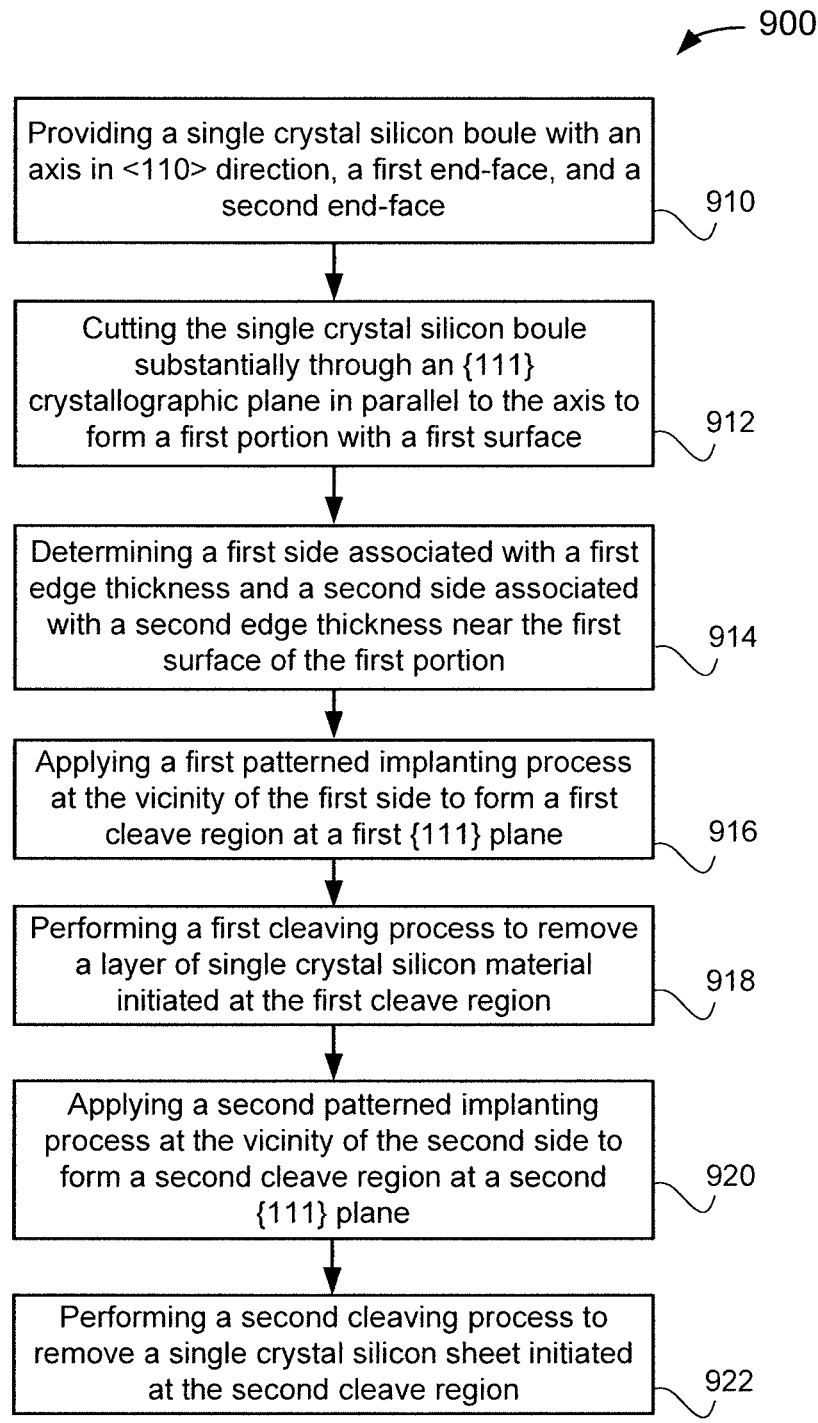
FIG. 9 is a simplified flowchart showing a method of slicing a shaped crystal ingot according to an alternative embodiment of the present invention.

FIG. 9 is a simplified flowchart showing a method of slicing a shaped crystal ingot according to an alternative embodiment of the present invention. This diagram is merely an example, which should not unduly limit the scope of the claims herein. One of ordinary skill in the art would recognize many variations, alternatives, and modifications. As shown, the method 900 includes a process (910) of providing a single crystal silicon boule with an axis in <110> direction and chopped at a first end-face and a second end-face that is a length away from the first end-face. Both the first end-face and second end-face can be substantially in an {110} crystallographic plane if the chopping is done perpendicularly to the <110> axis. In addition, the silicon boule with the length can be further cropped on its side faces. In particular, at least one side face can be selected to be in an {111} plane. For example, for a silicon boule with long axis in [110] direction, one side face can be in (−11-1) plane. Furthermore, other side faces can be selected to be either in parallel or perpendicular to the (−11-1) plane so that the cross section shape is a substantially squared shape (excepting chopped corners due to further cutting to form several minor side faces). In one example, the obtained single crystal silicon boule is the silicon boule 400 shown in FIG. 4. Of course, there can be many variations, alternatives, and modifications.

Additionally, the single crystal silicon boule includes a middle cross section plane that includes the <110> axis and is in parallel to at least the side face in an {111} plane. In other words, the cross section plane itself belongs to {111} plane family. The method 900 includes cutting the silicon boule along the middle cross section plane (Process 912) to separate the silicon boule into a first portion and a second portion each with a newly created surface that is substantially in an {111} plane. In a specific embodiment, the present invention provides an {111} plane based surface for layer transfer process in addition to the {110} plane based surface. For single crystal silicon, {111} plane is the best cleave plane followed by the {110} plane. Therefore, the benefits of the present invention, particularly the process 912, includes high productivity using low dose controlled cleave process with higher yield and formation of the cleave plane that has lower surface roughness. The cleaving process detail can be further described below. In one example, the cutting process 912 can be done using a wire sawing technique.

In one case, the first portion cut from the single crystal silicon boule (in Process 912) is used to continue subsequent processes particularly on the newly created surface in {111} plane. However, the cutting usually is not perfect so that the created surface can be off a miscut angle from the true {111} plane. For example, the surface of the first portion is miscut with an angle of 1 degree or 2 degrees off a (−11-1) plane. The method 900 then includes a process (914) of determining a first side associated with a first edge thickness and a second side associated with a second edge thickness near the surface of the first portion. In one embodiment, the first side is associated with a thinner edge thickness between the surface and a first {111} plane below the surface with the miscut angle. Thus, the second side is associated with a thicker edge thickness between the surface and the same {111} plane. In one example, the process 914 is to use an XRD technique for identifying the first edge thickness.

The next process is to apply a first patterned implanting process at the vicinity of the first side to form a first cleave region at the first {111} plane (Process 916). The patterned implanting process includes using ion beam generated from a linear accelerator system to irradiate the vicinity of the first side from the surface. The ion beam can be controlled in terms of its energy level, beam diameter, beam current, and pulse rate etc. so that a first cleave region can be created down to a certain depth below the surface. In one embodiment, the depth can be controlled to be substantially the same as the first edge thickness identified in Process 914. In another embodiment, the first cleave region is associated with a first {111} crystallographic plane. For example, the process 916 can be performed using step illustrated in FIG. 3B. In another example, the process 916 is similar to the process 816.

The method 900 further includes a process (918) of performing a first cleaving process to remove a layer of single crystal silicon material initiated at the first cleave region. In one embodiment, the first cleaving process is carried out through the first {111} crystallographic plane which is a best cleave plane for single crystal silicon, which is substantially similar to the cleaving process 818 performed on the {110} plane. In another embodiment, the Process 918 starts at the first side and finishes at the second side of the first portion, during which a blade with sharp edge is pushed in the first cleave region while the portion of the layer of the single crystal silicon material above the first cleave region is pulled up at the same time. In a specific embodiment, the first cleaving process is a controlled cleave process (CCP) developed by a co-inventor.

In certain embodiments, the first cleaving process is to reveal a new surface that is in true {111} crystallographic plane. When such a surface is exposed, a second patterned implanting process (Process 920) can be applied at the vicinity of the second side to form a second cleave region at a second {111} plane that is in parallel to the exposed surface. In one embodiment, the second patterned implanting process is substantially the same as the first patterned implanting process (916) with a controlled ion beam parameters to form the second cleave region in a desired depth. In another embodiment, the desired depth is associated with the second {111} plane. In one example, the second patterned implanting process is carried out at the second side identified in Process 914.

Subsequently, the method 900 includes a second cleaving process (Process 922) being performed to remove a single crystal silicon sheet initiated at the second cleave region. In one embodiment, the second cleaving process includes performing a CCP process through the second {111} crystallographic plane using a blade with sharp edge assisted with ultrasonic mechanical energy from top. In another embodiment, the Process 922 causes the formation of the single crystal silicon sheet having an {111} crystallographic plane, which is an alternative type of the single crystal silicon sheet that can be produced from a silicon boule with an <110> axis. The single crystal silicon sheet formed includes a thickness ranging from 20 microns to 180 microns which can be used for various semiconductor applications including photovoltaic cells. In yet another embodiment, the Process 922 is substantially similar to the process 822 performed on the {110} plane. According to embodiments of the present invention, certain above processes, particularly the processes 916 through 922, can be repeated in a successive manner to produce a plurality of single crystal silicon sheets, each with a desired thickness and surfaces in {111} plane. On each of the {111} type surfaces one or more photovoltaic regions can be formed in one or more subsequent processes.

Figure 10:
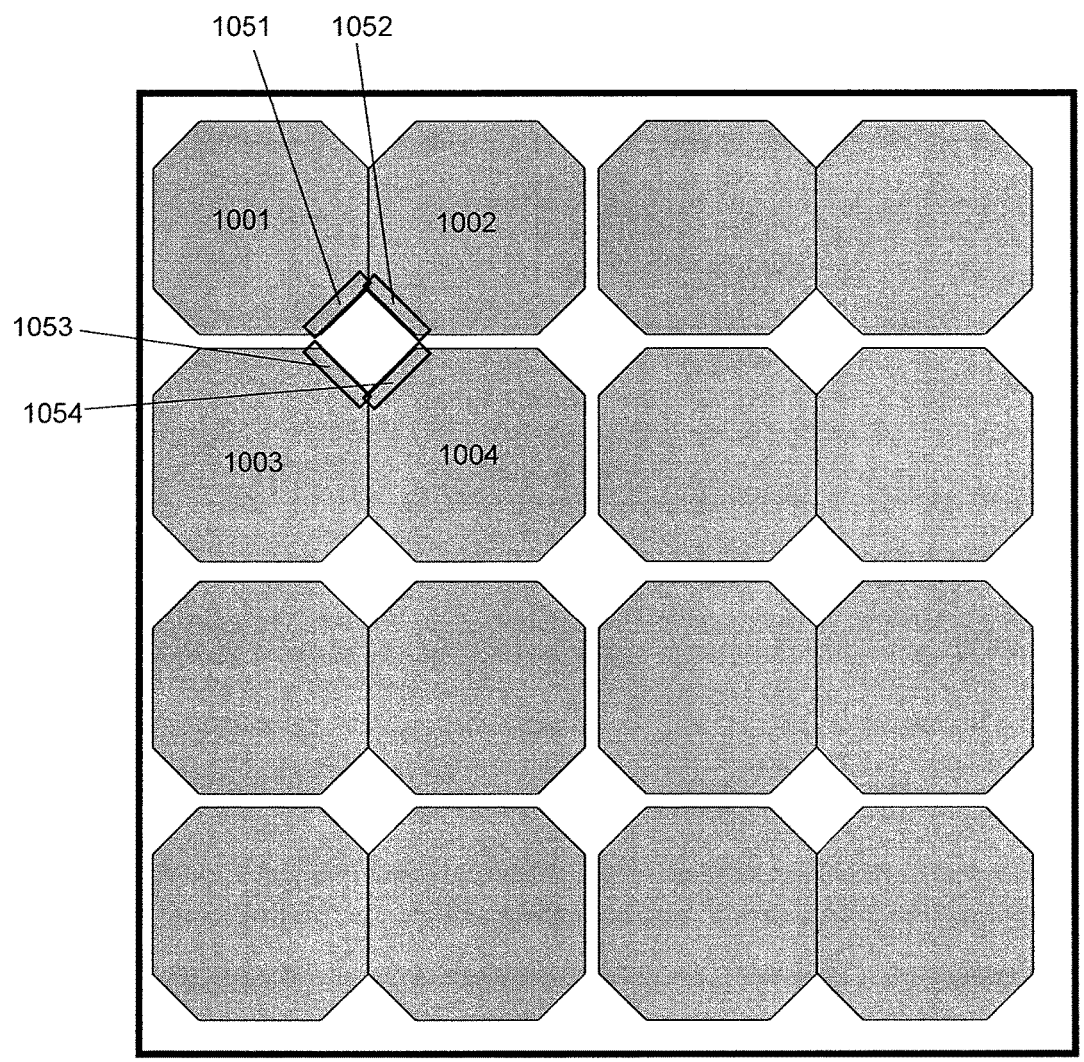
FIG. 10 is a simplified diagram showing a 4×4 tray arrangement of silicon ingots for forming spot initiation of cleave regions using patterned ion implantation according to an alternative embodiment of the present invention.

Referring to FIG. 8 and FIG. 9, the Process 816 or 916 is implemented as a preferred step in the whole cleave process sequence aiming to reduced cost and achieve desired productivity, yield, and quality goals. Instead of performing implantation on the whole sample area, embodiments of current invention based on patterned implantation allow a smaller localized initiation dose to be placed at an edge or corner of the boule or tile of silicon. For example, as shown in FIG. 3B and FIG. 3E, ion dose is applied to a limited area for each silicon boule or tile for forming a cleave region from which the cleaving action can be started. Additionally, embodiments of present invention provides a method for performing patterned ion implantation for multiple samples at substantially same time, aiming for further process optimization in high volume manufacture production. FIG. 10 is a simplified diagram showing a 4×4 tray arrangement of silicon ingots for forming spot initiation of cleave regions using patterned ion implantation according to an alternative embodiment of the present invention. This diagram is merely an example, which should not unduly limit the scope of the claims herein. One of ordinary skill in the art would recognize many variations, alternatives, and modifications. As shown, each silicon boule or tile is in a square shape with truncated or rounded corners and four such boules or tiles 1001, 1002, 1003, and 1004 are disposed in a 4×4 tray arrangement in this top view so that four corner regions are nearby with close proximity. In one embodiment, an initiation ion dose is placed at either an edge or a corner of the tile, because it is advantageous for naturally providing side access for propagation and the fracture mechanics also favors edge initiation and propagation from an edge. In this case, corner region is selected to be the initiation cleave region. Thus, an ion beam (not directly shown) with predetermined dose and energy level is applied over the four corner regions that are closely arranged, forming four cleave regions 1051, 1052, 1053, 1054 corresponding to the four silicon boules 1001, 1002, 1003, and 1004 respectively. The formation of the initiation cleave region can be carried out, for example, by executing the Process 816 of the method 800 or the Process 916 of the method 900. Of course, there are many variations, alternatives, and modifications. For example, the ion beam spot size may vary, the beam may need to scan around the four corner area if necessary depending on specific mechanical shape or desired size of cleave regions.

Figure 11:
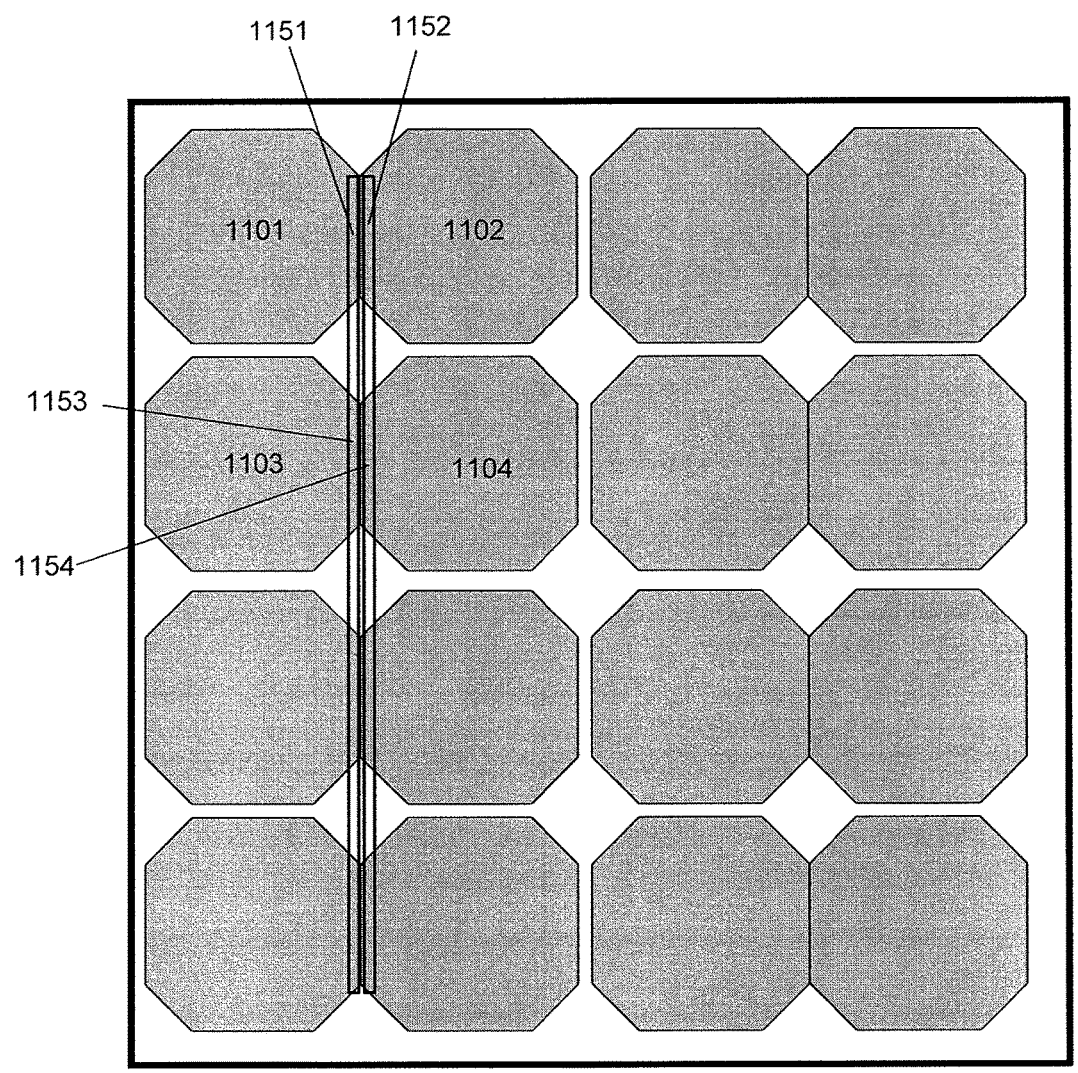
FIG. 11 is a simplified diagram showing a 4×4 tray arrangement of silicon ingots for forming line initiation of cleave regions using patterned ion implantation according to an alternative embodiment of the present invention.

FIG. 11 is a simplified diagram showing a 4×4 tray arrangement of silicon ingots for forming line initiation of cleave regions using patterned ion implantation according to an alternative embodiment of the present invention. This diagram is merely an example, which should not unduly limit the scope of the claims herein. One of ordinary skill in the art would recognize many variations, alternatives, and modifications. As shown, the silicon boules or tiles 1101, 1102, 1103, 1104 are arranged in the same manner of a 4×4 arrangement as in FIG. 10, however, the edge region instead of corner region is selected to form the initiation cleave region. Thus the ion beam is applied over regions where two edge regions 1151 and 1152 of two neighboring boules 1101 and 1102 are close by a proximity distance. Then, the beam can be scanned down the line to cover additional edge regions 1153 and 1154 for a second pair of silicon boules 1103 and 1104, and further to a third pair, and so on.

In one embodiment of current invention, high energy H ions generated from a linear accelerator system are used forming the initiation cleave region. The beam current can be about 2 mA and particle energy is accelerated to 4 MeV range. The H-dose is large enough that once the initiation cleave region is formed a thermal process allows cleaving action to start from the cleave region without much additional energy application. In an specific embodiment, it is found that the initiation action fails to function if the H-dose is below about a $4.5 \times 10^{16}$ cm$^{-2}$ to $5 \times 10^{16}$ cm$^{-2}$ range.

In another embodiment, as a $5 \times 10^{16}$ cm$^{-2}$ dose is applied over 1.5 cm×1.5 cm edge or corner area, the implant current needed is about 1-2 mA. Compared to a 15 cm squared tile, the patterned implantation takes just 1% of total area of the tile. For average dose of $1 \times 10^{16}$ cm$^{-2}$, in order to cover the whole area of tile, a 20 mA beam current is required. Therefore, there is a large advantage to be gained by reducing the dose for rest area excepting the initiation cleave region or even completely cutting off the beam. Purposely selecting {111} or {110} planes for propagation of the thick film according to certain embodiments make it possible. In one embodiment, the H-dose for thermal propagating can be reduced down to about $2-3 \times 10^{16}$ cm$^{-2}$, even the cleave plane is off from the most desired crystallographic planes. For certain cleave plane with a slightly miscut angle from true (111) planes, the minimum ion dose can be further reduced to slightly above $1 \times 10^{16}$ cm$^{-2}$ range. Furthermore, for a cleave plane along true (111) crystallographic plane, in principle, the ion dose can be reduced substantially low of zero dose. Effectively, this enhances the productivity for high volume manufacturing.

In a specific embodiment, the present method can perform other processes. For example, the method can place the removed single crystal silicon sheet on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the type of ions, which are typically hydrogen ions, can be replaced using co-implantation of helium and hydrogen ions or deuterium and hydrogen ions to allow for formation of the cleave region with a modified dose and/or cleaving properties according to alternative embodiments. Still further, the cleaving process may include temperature controlled/assisted cleaving utilizing vacuum chucking or electrostatic chucking process. Of course there can be other variations, modifications, and alternatives. Therefore, the above description and illustrations should not be taken as limiting the scope of the present invention which is defined by the appended claims.

What is claimed is:

1. A shaped crystalline ingot for an ion cleaving process, the shaped crystalline ingot comprising:
   a major surface that is substantially planar along a crystallographic plane;
   a first side face that is substantially planar along a first direction orthogonal to the major surface; and
   a second side face that is substantially planar along a second direction orthogonal to the major surface,
   wherein the ion cleaving process is a process in which ions are implanted into the shaped crystalline ingot to form a cleave plane that separates a substrate comprising the major surface from the shaped crystalline ingot.

2. The shaped crystalline ingot of claim 1, wherein the shaped crystalline ingot is cut from a crystalline material boule that has a cropped structure including a first end-face, a second end-face, and a length along an axis in a crystallographic direction substantially extending from the first end-face to the second end-face,
   wherein the first and the second side faces correspond to the first end-face and the second end-face of the crystalline material boule, respectively, and
   wherein the crystallographic plane is parallel to the axis.

3. The shaped crystalline ingot of claim 1, further comprising:
   a first corner face extending from the first side face to the second side face; and
   a second corner face extending from the first side face to the second side face, the second corner face being separate from the first corner face,
   wherein the first corner face defines a first obtuse angle with a back surface that is parallel to and separate from the major surface, and the second corner face defines a second obtuse angle with the back surface.

4. The shaped crystalline ingot of claim 2, wherein the crystallographic direction is selected from the group consisting of <100>, <110>, and <111>.

5. The shaped crystalline ingot of claim 1, wherein the crystallographic plane is selected from the group consisting of {100}, {110}, and {111}.

6. The shaped crystalline ingot of claim 1, wherein the crystalline material comprises a semiconductor.

7. The shaped crystalline ingot of claim 1, wherein the crystalline material comprises silicon.

8. The shaped crystalline ingot of claim 2, wherein the first end-face corresponds to a first cutting plane of a crystalline material ingot along a first cross section perpendicular to the crystallographic direction, and the second end-face corresponds to a second cutting plane of the crystalline ingot along a second cross section perpendicular to the crystallographic direction,
   wherein the shaped crystalline ingot has a substantially squared cross section shape with at least one side face in one crystallographic plane, which is obtained by cropping partially side-sections of the crystalline ingot, and
   wherein the crystalline ingot is grown in the crystallographic direction.

9. The shaped crystalline ingot of claim 8 wherein the squared cross section shape comprises a dimension substantially equal to the length along the axis in the crystallographic direction.

10. The shaped crystalline ingot of claim 2, wherein the shaped crystalline ingot is obtained by cutting a crystalline material boule using a wire saw.

11. The shaped crystalline ingot of claim 1, wherein the major surface comprises a miscut angle off from one crystallographic plane, the miscut angle being 0 to 2 degrees.

12. The shaped crystalline ingot of claim 1, wherein the major surface of the shaped crystalline ingot is exposed by a first side associated with a first edge thickness from the major surface to a crystallographic plane within the shaped crystalline ingot and a second side associated with a second edge thickness from the major surface to said crystallographic plane, the first edge thickness being smaller than the second edge thickness.

13. The shaped crystalline ingot of claim 12, wherein the ion cleaving process comprises a first implanting process to perform a patterned ion-implantation at a vicinity of the first side to form a first cleave region at the first edge thickness below the major surface.

14. The shaped crystalline ingot of claim 13, wherein the ion cleaving process further comprises a first cleaving process initiated at the first cleave region to remove a layer of crystalline material from the first side to the second side in one first crystallographic direction within the crystallographic plane.

15. The shaped crystalline ingot of claim 14, wherein the first cleaving process comprises using a movable blade with sharp edge and assisting ultrasonic energy with the movable blade.

16. The shaped crystalline ingot of claim 13, wherein the ion cleaving process further comprises a second implanting process to perform a patterned ion-implantation at a vicinity of the second side after the first cleaving process to form a second cleave region at a predetermined thickness below the first cleave region.

17. The shaped crystalline ingot of claim 16, wherein the ion cleaving process further comprises a second cleaving process initiated at the second cleave region, the second cleaving process being substantially similar to the first cleaving process, to remove a crystalline material sheet.

18. The shaped crystalline ingot of claim 17, wherein a thickness of the crystalline material sheet is from 20 microns to 180 microns.

19. The shaped crystalline ingot of claim 17, wherein the ion cleaving process is further carried out in a successive manner by repeating the second implanting process and the second cleaving process to remove the plurality of crystalline material sheets one after another.

20. The shaped crystalline ingot of claim 19, wherein each of the plurality of the crystalline material sheets includes one or more photovoltaic regions formed thereon.

\* \* \* \* \*